(12) United States Patent
Arthur et al.

(10) Patent No.: US 8,293,455 B2
(45) Date of Patent: Oct. 23, 2012

(54) MANDREL

(75) Inventors: Alan R. Arthur, Salem, OR (US);
Ronald A Hellekson, Eugene, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 970 days.

(21) Appl. No.: 12/251,055

(22) Filed: Oct. 14, 2008

(65) Prior Publication Data

US 2010/0092889 A1 Apr. 15, 2010

Related U.S. Application Data

(60) Provisional application No. 61/024,901, filed on Jan. 30, 2008.

(51) Int. Cl.
*G03F 7/00* (2006.01)
(52) U.S. Cl. ...................................... 430/311
(58) Field of Classification Search ................. 430/311; 264/294
See application file for complete search history.

(56) References Cited

U.S. PATENT DOCUMENTS

| | | | |
|---|---|---|---|
| 4,000,054 A | 12/1976 | Marcantonio | |
| 4,075,756 A | 2/1978 | Kircher et al. | |
| 5,573,959 A | 11/1996 | Kodaira et al. | |
| 6,190,922 B1 | 2/2001 | Chen | |
| 6,326,120 B1 | 12/2001 | Wang et al. | |
| 6,407,786 B1 | 6/2002 | Yamamoto et al. | |
| 6,713,328 B2 | 3/2004 | Dai et al. | |
| 6,829,030 B2 | 12/2004 | Hagiwara | |
| 6,924,865 B2 | 8/2005 | Ohta et al. | |
| 2004/0226824 A1* | 11/2004 | Murata et al. | 205/50 |
| 2005/0274693 A1* | 12/2005 | Heidari et al. | 216/52 |
| 2007/0097292 A1* | 5/2007 | Clark et al. | 349/86 |
| 2007/0292773 A1* | 12/2007 | Kim et al. | 430/5 |
| 2009/0046362 A1* | 2/2009 | Guo et al. | 359/486 |
| 2010/0038539 A1* | 2/2010 | Endres et al. | 250/332 |

* cited by examiner

*Primary Examiner* — Brittany Raymond

(57) ABSTRACT

Pixel wells and a grid of electrical lines including electrical bridges are formed using an ultraviolet transparent mandrel having a three-dimensional surface and an integrated mask.

31 Claims, 10 Drawing Sheets

MANDREL

CROSS REFERENCE TO RELATED APPLICATIONS

This Application claims the benefit of U.S. Provisional Application serial number 61/024901, filed Jan. 30, 2008, titled "Mandrel" which is hereby incorporated by reference herein as if reproduced in full below.

BACKGROUND

Displays and other electronic devices may include wells containing liquid crystals or other electro-optical materials which are selectively activated using a grid of electrical lines. Forming such wells and electrical lines is often complex and expensive and may lack adequate feature alignment, especially when formed as part of a flexible plastic display.

DETAILED DESCRIPTION OF THE EXAMPLE EMBODIMENTS

Figure 1:
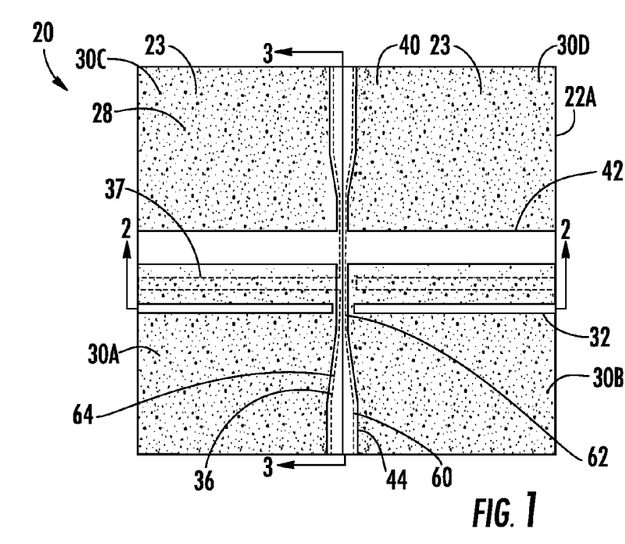
FIG. 1 is a top plan view of a portion of a stacked display according to an example embodiment.
Figure 2:
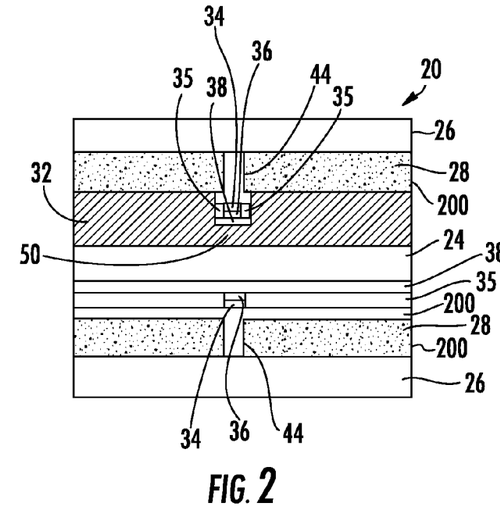
FIG. 2 is a sectional view of the stacked display of FIG. 1 taken along line 2-2 according to an example embodiment.
Figure 3:
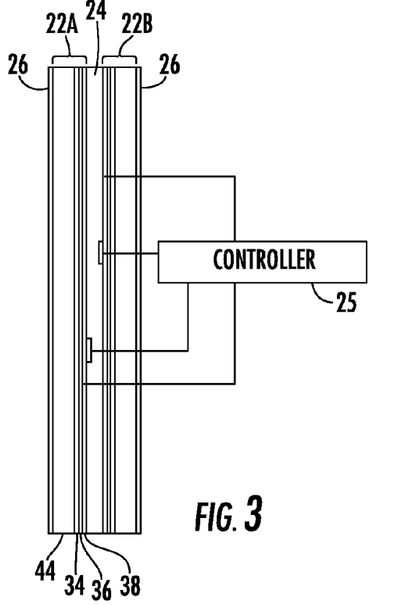
FIG. 3 is a sectional view of the stacked display of FIG. 1 taken along line 3-3 according to an example embodiment.

FIGS. 1-3 illustrate stacked display 20 according to an example embodiment. FIG. 1 is a top plan view of one side of stacked display 20. FIG. 2 is a sectional view of stacked display 20 taken along line 2-2 of FIG. 1. FIG. 3 is a sectional view of stacked display 20 taken along a line 3-3 of the FIG. 1. As will be described hereafter, stacked display 20 may be fabricated in a less costly and less complex manner while achieving enhanced feature alignment.

Stacked display 20 includes two oppositely facing display backplanes 22A, 22B (collectively referred to as backplanes 22) joined to one another by an intermediate bonding layer 24 (shown in FIGS. 2 and 3) and controller 25. Each backplane 22 cooperates with a containing structure such as a cover or lid 26 to contain an electro-optical material 28. Since backplanes 22A and 22B are substantially identical to one another only backplane 22A will be described. As shown by FIGS. 1-3, backplane 22A forms an array of display pixels 23 and includes a grid, matrix or array of pixel wells 30A, 30B, 30C and 30D (collectively referred to as pixel wells 30), a series or set of electrical conductor lines 32 (one of which is shown), a series or set of catalytic material lines 34 (one of which is shown), a series or set of electrical conductor lines 36 (one of which is shown), electrodes 37 and dielectric layer 38.

Pixel wells 30 comprise basins or wells configured to receive, contain or partition electro-optical material 28. In the example illustrated, pixel wells 30 are integrally formed as part of a single unitary body, wherein a surface of each of wells 30 is provided by a single integral layer of material. As a result, fabrication of floors 40 and sidewalls 42, 44 may be concurrently performed, reducing processing steps and cost. In other embodiments, pixel wells 30 may be separately formed and may be formed from other materials.

As shown by FIG. 1, each of pixel wells 30 includes a floor 40 and the side walls 42, 44. Side walls 42, 44 project above and away from floor 40 to form a recessed cavity that receives and partitions electro-optical material 28. Side walls 42 and 44 extended substantially orthogonal or perpendicular to one another. Each pixel well 30 is completely surrounded by side walls 42, 44. Each pixel well 30 includes a pair of spaced parallel side walls 42 and a pair of spaced parallel side walls 44 forming a rectangular or square recess containing electro-optic material 28. In other embodiments, the sidewalls may form a cavity having other shapes, including but not limited to hexagon shaped cavities.

Electro-optical material 28 comprises one or more charge responsive optical materials configured to change between different optical states in response to an applied electrical field or electrical charge applied by conductor line 32 and the branch 37 of conductor line 36. In one embodiment, electro-optical material 28 may be configured to change between a transparent or translucent state and an opaque state in response to an applied electrical field or electrical charge. As noted above, the opaque state may comprise a colored state such as cyan, magenta, yellow, red, green, blue or other colors. The opaque state may also comprise a darkened gray or black state. Examples of electro-optical material include, but are not limited to, dyed or undyed polymer dispersed liquid crystal, dispersions or solutions of charged particles or pigments or possibly electro chromatic materials.

In particular embodiments, electro-optical material 28 may be configured to exhibit different characteristics or to actuate between different states in response to different voltages or charges or in response to different frequencies. For example, in one embodiment, electro-optical material 28 may be configured to exhibit different degrees of opaqueness or translucency in response to different charges or applied electrical fields. In another embodiment, such as when electro-optical material 28 includes phosphors, electro-optical material 28 may emit light in response to a first range of frequencies and may not emit light or may emit light to a different extent in response to a second range of frequencies.

Conductor lines 32 comprise parallel lines or bands of electrically conductive material such as but not limited to nickel or copper extending across pixel wells 30. Conductor lines 32 have surfaces recessed below floor 40 or exposed along floors 40. In the example illustrated, the recessed surface of conductor lines 32 are exposed through overlying recesses in floor 40. In other embodiments, conductor lines 32 may be extended so as to extend flush with a surface of floor 40 or so as to project above the surface of floor 40. As shown by FIG. 2, the exposed portions of conductor lines 32 terminate just prior to side walls 44 yet continuously extend and are connected below side walls 44 by means of an electroplated crossover or electrical bridge 50.

Catalytic material lines 34 comprise bands or lines of a dielectric catalytic material extending parallel to one another and generally orthogonal to conductor lines 32. In the example illustrated, catalytic material lines 34 extend generally opposite to side walls 44. Catalytic material lines 34 form and define conductor lines 36 and their associated finger electrodes 37. In one embodiment, catalytic material lines 34 are formed from a photo patternable catalytic dielectric material having a polarity opposite to that of photopolymer layer 35. In the example illustrated in which resist layer 35 comprises a negative photopolymer, catalytic material lines 34 are formed from a positive photopolymer. In one embodiment, catalytic material lines 34 may be formed from a photopolymer that is built with elements such as palladium. For example, in one embodiment, lines 34 may be formed from positive Photoimageable Auto-catalytic Resin Metallization (PAR) material commercially available from Rohm & Haas. In other embodiments, other catalytic materials, such as photopatternable catalytic inks may be used to form catalytic material lines 34.

Polymer layer 35 (shown in FIG. 2) comprises a layer of a photo patternable material. Polymer layer 35 extends on opposite sides of catalytic material lines 34 and on opposite sides of conductor lines 36. Polymer layer 35 forms channel sides 52, side edges of resist layer 35, that are in substantial if not perfect alignment with side edges of catalytic material lines 34. Channel sides 52 of polymer layer 35 abut and contact side edges of catalytic material lines 34. Channel sides 52 and resist layer 35 further abut and contact side edges of conductor lines 36.

In the example illustrated, polymer layer 35 is formed from a negative photoresist material such as SU-8. In other embodiments, polymer layer 35 may be formed from other negative photopolymer materials. In still other embodiments, polymer layer 35 may be formed from a positive photopolymer material, wherein catalytic material lines 34 are formed from an opposite polarity photo-patternable material, a negative polarity photo patternable catalytic resin material. In still other embodiments, polymer layer 35 may be omitted or removed, wherein one or more other dielectric layers extend on opposite sides of catalytic material lines 34 and conductor lines 36. For example, in one embodiment, dielectric layer 38 may not only extend over conductor lines 36 but also along the sides or edges of conductor lines 36 and catalytic material lines 34.

Conductor lines 36, one of which is shown, comprise a set or series of spaced parallel bands or lines of electrically conductive material. Conductor lines 36 extend substantially orthogonal or perpendicular to conductor lines 32. As shown by FIG. 2, conductor lines 36 extend beneath or opposite to side walls 44 and beneath or opposite to electrical bridge 50. As shown by FIG. 1, conductor lines 36 have a wide portion 60, a narrow portion 62 and a tapering portion 64 extending between wide portion 60 and narrow portion 62. Because conductor lines 36 have wide portion 60, conductor lines 36 have satisfactory electrical conductivity without detrimental resistance drop. At the same time, narrow portion 62 of conductor lines 36 facilitate the forming of electrical bridges 50 with electroplating. Conductor lines 36 are formed upon catalytic material lines 34. In the example illustrated, conductor lines 36 are formed from electrically conductive material that is configured to be electrolessly plated upon catalytic material lines 34. In one embodiment, conductor lines 36 are formed from copper. In other embodiments, conductor lines 36 may be formed from other materials capable of electroless plating such as nickel.

Electrodes 37 comprise pads, terminals or other structures of one or more electrically conductive materials extending within each pixel well 30 and electrically connected to conductor lines 36. Electrodes 37 are configured to have a different charge or to be placed at distinct electrical potentials so as to apply an electrical field or charge to the electro-optical material 28 within their associated pixel well 30.

Dielectric layer 38 comprises one or more layers of one or more dielectric materials sandwiched between conductor lines 36 and electrical bridge 50 of conductor lines 32. Dielectric layer 38 is sufficiently electrically insulative and is sufficiently thick to substantially insulate conductor lines 36 from conductor lines 32 at electrical bridge 50. In the example illustrated, dielectric layer 38 is formed from a dielectric material configured to be blanket coated and plasma etched. In one embodiment, dielectric layer 38 is formed from photopolymers like SU-8. In other embodiments, dielectric layer 38 may be formed from thermally cured, two part, or thermally initiated or otherwise cured polymers compounds. In particular embodiments, portions of layer 38 and floor 40 above electrodes 37 may be removed.

In the particular example illustrated, each pixel 30 is illustrated as including two electrodes: one electrode provided by electrode 37 and associated conductor line 36 and another electrode provided by conductor lines 32. As a result, distinct electrical fields or charges may be applied to electro-optical material 28 within wells 30 using different conductor lines 32 and different electrodes 37. For example, one of electrodes 37 may be configured to cooperate with conductor line 32 to apply first voltage or electrical potential to electro-optical material 28 in one of pixel wells 30 while another of electrodes 37 may be configured to cooperate with conductor line 32 to apply a second distinct voltage or electrical potential to electro-optical material 28 in a different pixel well 30. In one embodiment, one of electrodes 37 may be configured to cooperate with conductor line 32 to apply a voltage at a first frequency to electro-optical material 28 while another of electrodes 37 is configured to cooperate with conductor line 32 to apply the same voltage or different voltage with a different frequency to electro-optical material 28.

Although pixel wells 30 are each illustrated as having two electrodes: electrode 37 and electrode 32, in other embodiments, pixels 30 may have fewer or greater of such electrodes. In one embodiment, pixel wells 30 each may alternatively include more than one conductor line 36 with associated electrode 37 or more than one electrode line 32 per pixel well.

Controller 25 comprises one or more processing units configured to generate electrical control signals for selectively actuating electro-optical material 28 of individual pixel wells 30. As schematically represented in FIG. 3, controller 34 is electrically connected to conductor lines 32, 36. The electrical signals transmitted to each pixel well 30 results in an electrical charge or field being applied to the electro-optical material 28 within each pixel well 30 to selectively actuate each pixel 23.

For purposes of this application, the term "processing unit" shall mean a presently developed or future developed processing unit that executes sequences of instructions (such as video or display driver instructions) contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. For example, controller 25 may be embodied as part of one or more application-specific integrated circuits (ASICs). Unless otherwise specifically noted, the controller is not limited to any specific combination of hardware circuitry and software, nor to any particular source for the instructions executed by the processing unit.

As shown in FIGS. 2 and 3, backplane 22A, described above, is joined to another substantially identical back plane 22B by bonding layer 24 to at least partially form a stacked display 20. Bonding layer 24 extends between dielectric layer 38 of backplanes 22A and 22B. In the example illustrated, bonding layer 24 contacts dielectric layers 38. In the example illustrated, bonding layer 24 comprises one or more layers of adhesive material such as Norlan Optical Adhesive. In other embodiments, bonding layer 24 may formed from other adhesive materials.

Lids 26 comprise panels of transparent or translucent material extending across opposite sides of backplanes 22 so as to contain and/or protect electro-optic material 28 within pixel wells 30. In one embodiment, lids 26 are joined to top surfaces of side walls 42 and 44 to form a seal thereagainst. In other embodiments, lids 26 may include additional optical layers configured to reduce glare or to polarize light.

Overall, backplanes 22A and 22B are configured to be fabricated or formed in fewer steps and with less waste, lowering costs. For example, backplanes 22 are configured to be formed using a reusable mandrel which defines and aligns many of the features of the backplanes. Backplanes 22 are configured to be formed using a single integral mask layer in such a reusable mandrel. Because backplanes 22 have pixel wells 30 that are formed on the same mandrel that also forms conductors 32, 36, backplanes 22 reduce the need for a secondary process to create pixel wells that are aligned to conductors or electrodes.

At the same time, backplanes 22A and 22B achieve enhanced feature alignment. For example, the architecture of backplanes 22 facilitates pixel well to conductor alignment in spite of any dimensional instability of the material chosen to form pixel wells 30. As a result, pixel well 30 may be formed from a resin, plastic or polymeric material which may exhibit dimensional instability. Backplanes 22 facilitate use of a committed mandrel which enhances dimensional stability of the display through all alignment steps during manufacturing. Because backplanes 22 facilitate use of a mask integrated into a mandrel, thermal matching of an independent mask to the mandrel may be eliminated thus eliminating independent mask to mandrel topography alignment challenges/costs. Thermal changes affect both the mask and its integrated mandrel to the same extent, maintaining feature alignment.

In addition, backplanes 22 provide enhanced quality. In particular, backplanes 22 provide for a shorter optical path through the display, resulting in less optical cross talk. Because backplanes 22 are configured to be built from the bottom up upon a mandrel, backplanes 22 reduce problems of bubbles in under layers that generally occur when attempting to emboss sparse density features into blanket resin coatings.

FIGS. 4-24 illustrate one example method for forming backplanes 22 and display 20. In the example illustrated, backplanes 22A and 22B are first independently formed and then joined to one another while still attached to the mandrels to ensure feature alignment. Once backplanes 22A and 22B are bonded together, the mandrels are removed providing the aligned assembly. Since the fabrication of backplane 22A is identical to the fabrication of backplane 22B, a redundant description of a step for forming backplane 22B will be omitted. In the example illustrated, backplane 22A is formed using a dedicated ultraviolet (UV) transparent mandrel having a three-dimensional surface and an integral mask layer.

Figure 4:
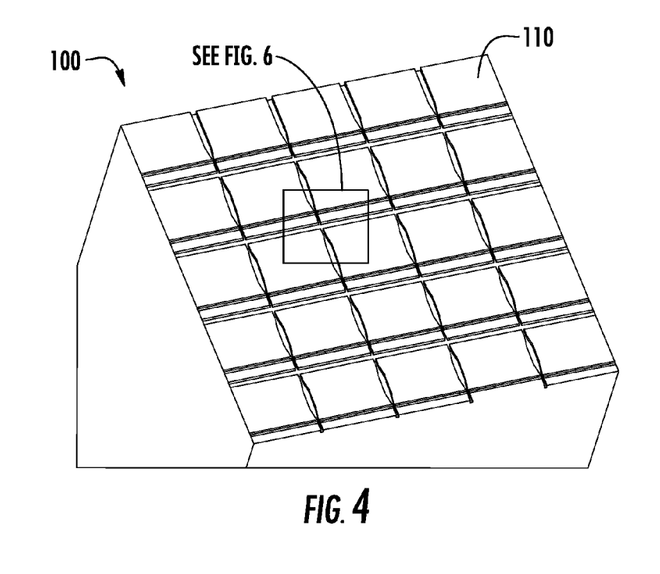
FIG. 4 is a top perspective view of a portion of a mandrel according to an example embodiment.
Figure 5:
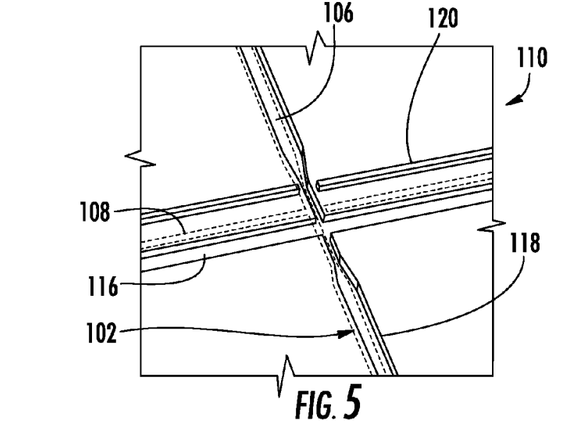
FIG. 5 is an enlarged fragmentary perspective view of the mandrel of FIG. 4 with portions shown in transparency to illustrate an integrated mask of the mandrel according to an example embodiment.
Figure 6:
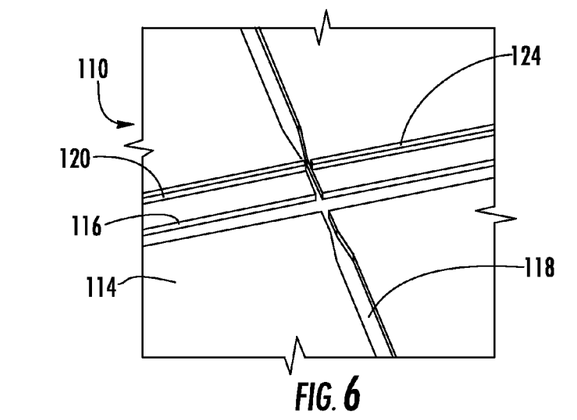
FIG. 6 is an enlarged fragmentary perspective view of the mandrel of FIG. 4 to illustrate a varied topography of the mandrel according to an example embodiment.

FIGS. 4-6 illustrate one example mandrel 100 that may be used to form back plane 22A. FIG. 4 illustrates a portion of mandrel 100. In particular embodiments, mandrel 100 may have a much larger and extensive surface area for forming much larger backplanes. FIGS. 5 and 6 are enlarged views of a portion of mandrel 100. As shown by FIG. 4, mandrel 100 comprises a structure formed from one or more materials and one or more layers configured such that portions of mandrel 100 are configured to transmit UV light while other portions of the mandrel 100 are configured to attenuate or block transmission of UV light. In the example illustrated, mandrel 100 is formed from one or more UV transparent materials, such as quartz. Portions of mandrel 100 are provided with an integrated photomask 102 (shown in FIG. 5). FIG. 5 depicts portions of mandrel 100 as transparent to illustrate integrated photomask 102. As shown by FIG. 5, photomask 102 comprises a patterned layer of UV blocking or attenuating material permanently provided as part of mandrel 100. In one embodiment, photomask 102 is formed upon one side of mandrel 100, wherein the other opposite side of mandrel 100 has a surface used to define features of backplane 22A. In other embodiments, photomask 102 may be embedded within the structure of mandrel 100. In one embodiment, photomask 102 is formed from a patterned layer of chrome that is subsequently coated with TEOS that is subsequently patterned and etched to provide the desired topography. In other embodiments, photomask 102 may be formed from other UV blocking or attenuating materials.

As further shown by FIG. 5, photomask 102 includes mask lines 106 and mask lines 108. Mask lines 106 comprise a series or set of spaced parallel lines of mask material extending across mandrel 100. Mask lines 106 have a width corresponding to a desired width of catalytic material line 34, conductor lines 36 and a width of the channel formed between sides 52 of polymer layer 35, each of which is shown in FIG. 2. Although mask lines 106 are shown at locations corresponding to each of the side walls 44 of the backplane 22A being formed by mandrel 100, in other embodiments, mask lines 106 may be at other non-aligned locations.

Mask lines 108 extend from mask lines 106 at locations corresponding to interiors of each of pixel wells 30 along floors 40 (shown in FIG. 1). Mask lines 108 serve to define subsequently formed lines of electrically conductive material which is providing electrodes within the interiors of pixel wells 30. In the example illustrated, mask lines 108 extend substantially perpendicular or orthogonal to mask lines 106.

According to one example embodiment, mask lines 106 have a width of between about 3 microns- and 50 microns and nominally about 20 microns. Mask lines 108 have a width of between about 4 microns and 20 microns- and nominally about 5 microns. In other embodiments, mask lines 106 and 108 may have other dimensions.

As shown by FIGS. 4 and 6, mandrel 100 further includes a backplane forming or defining three-dimensional topography 110 on a first side of mandrel 100. In use, UV light is supplied are provided on the second opposite side of mandrel 100, wherein the UV light passes through mandrel 100 and through topography 110 except at those locations where mask lines 106 and 108 are provided. As shown by FIGS. 4 and 6, topography 110 is varied to include features that define pixel wells 30 and electrical or conductor lines. In particular, topography 110 has multiple levels or heights which locate different sets of electrical or conductor lines and which further locate and form floor 40 and side walls 42, 44 of pixel wells 30.

In the example illustrated, topography 110 includes the following features: main plateau surfaces 114, channels 116, channels 118 and projecting walls 120. Sources 114 of topography 110 are completely bounded or surrounded by channels 116, 118. Surfaces 114 have a Z-axis (axis orthogonal to topography 110) height relative to the bottom of channels 116, 118 that corresponds to the relative depth of floors 40 with respect to the top of side walls 42, 44. In other words, surfaces 114 extend at a level that forms floors 40.

Channels 116 comprise a series or set of parallel spaced channels extending across topography 110 and across mandrel 100. Channels 116 each have a depth corresponding to a height of side walls 42(shown in FIG. 1). Channels 116 each have a width corresponding to a width of side walls 42. Channels 116 are at locations corresponding to the locations of side walls 42.

Channels 118 comprise a series or set of parallel spaced channels extending across topography 110 and across mandrel 100. In the example illustrated, channels 118 extend orthogonal to channels 116. Channels 118 each have a depth corresponding to a height of side walls 44 (shown in FIG. 1). In the example illustrated, channels 118 each have a depth corresponding to a depth of channels 116. As a result, side walls 42 and 44 have substantially the same height, facilitating enhanced and simplified joining of lids 26 to backplanes 22. In other embodiments, channels 118 114 and 116 may have different depths. They may also have varying depths within each channel to form crenellations or castellations. Channels 118 each have a width corresponding to a width of side walls 44. Channels 118 are at locations corresponding to the locations of side walls 44.

Projecting walls 120 comprise proud projections extending above surfaces 114. Projecting walls 120 have top surfaces 122 coated or covered with a layer 124 of electrically conductive material to facilitate subsequent electroplating of conductor lines 32. In the embodiment illustrated, layer 124 is continuous across the whole surface of mandrel 110 in order to provide electrical continuity for plating. Subsequent plating upon layer 124 is just on the top of walls 120 due to the processing sequence, height differences and pre-existing polymer layer when the plating step occurs. In yet other embodiments, layer 124 may alternatively be embedded within walls 120 sufficiently close to the top of walls 120 for electroplating rather than the conductive material being on top of walls 120. In the embodiment illustrated, layer 124 comprises a transparent electrically conductive material such as indium tin oxide. As a result, UV light may be transmitted through layer 124 to facilitate photo patterning of resist materials.

Projecting walls 120 extend in lines at locations corresponding to conductor lines 32 (shown in FIG. 1). Projecting walls 120 are segmented by channels 118 that extend across walls 120. Terminal end points of projecting walls 120 on opposite side of channel 118 are sufficiently close such that the electrically conductive material being electroplated upon walls 120 may bridge across this gap to form an electrical bridge or cross over 50 (shown in FIG. 2). Projecting walls 120 have a height sufficiently large such that catalytic material lines 34, conductor lines 36 and dielectric layer 38 (shown in FIG. 2) may be stacked within the gap between the terminal end points of walls 120 and above the level of surface 114 without exceeding the height of walls 120 and layer 124.

According to one example embodiment, channels 116 and 118 each have a depth below surface 114 of between about 5 microns and 20 microns and nominally about 10 microns. Channels 116 have a width of between about 5 microns and 100 microns and nominally about 30 microns. Channels 118 have a width of between about 5 microns and 100 microns and nominally about 30 microns at the widest point as shown and a width of between about 2 microns and 8 microns and nominally about 5 microns at the narrowest point as shown. Projecting walls 120 have a height above the surface 114 of between about 2 microns and 10 microns and nominally about 6 microns. Layer 124 has a height above the surface 114 of between about 2 and 10 microns and nominally about 6 microns. Projecting walls 120 have a width of between about 3 microns and 20 microns and nominally about 4 microns. In other embodiments, the dimensions of such features of topography 110 may have other dimensions.

Figure 7:
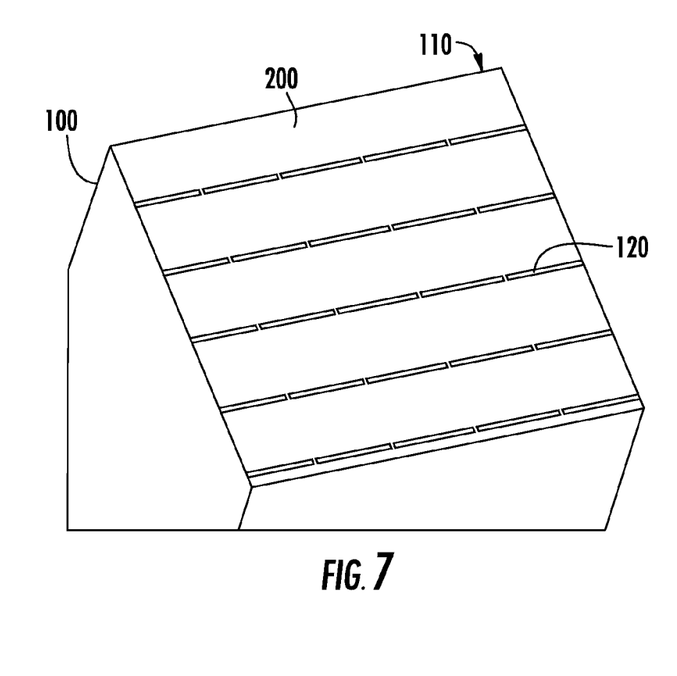
FIG. 7 is a top perspective view illustrating formation of a first layer over the varied topography of the mandrel according to an example embodiment.

FIGS. 7-19 illustrate use of mandrel 100 to form backplane 22A. As shown by FIG. 7, a layer 200 of dielectric material is deposited or otherwise formed upon topography 110 of mandrel 100. Layer 200 is deposited so as to fill channels 116, 118 (shown in FIGS. 4-6) and so as to extend across and over surface 114. Top 122 of walls 120 are exposed above layer 200. Layer 200 subsequently forms pixel wells 30 (shown in FIG. 1) upon separation from mandrel 100.

In the example illustrated, layer 200 is formed by blanket coating topography 110 with a plastic, polymer or resin material which is subsequently solidified or cured. In one embodiment, layer 200 comprises a polymer resin having a thickness (after any portions are removed to expose layer 24 and/or tops 122 of walls 120) of between about 0.5 microns and about 3 microns, and nominally about 1 micron. In other embodiments, layer 200 may be formed from other plastics or polymers and may have other thicknesses. Any portions of layer 200 extending over projecting walls 120 are subsequently removed. For example, layer 200 may be plasma etched until tops 122 of walls 120 or tops of layer 124 are exposed through layer 200.

Figure 8:
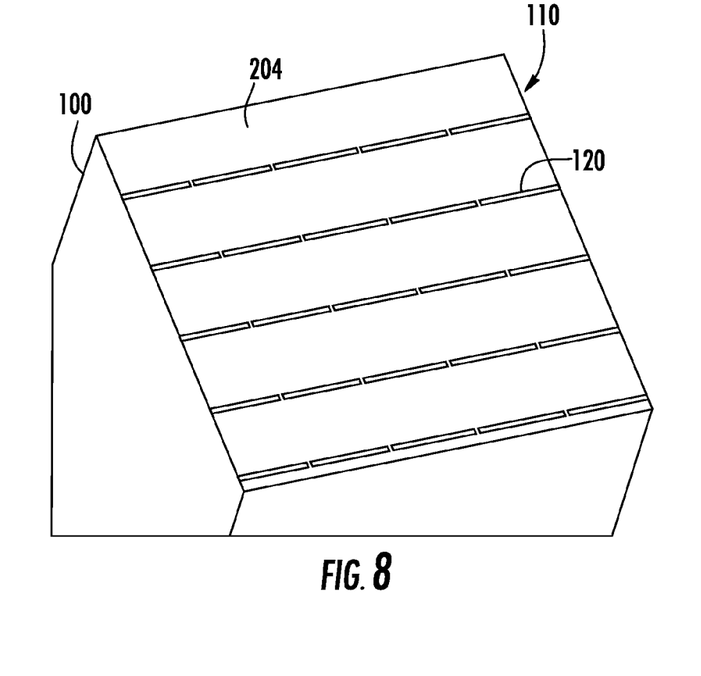
FIG. 8 is a top perspective view illustrating formation of a second catalytic layer over the first layer according to an example embodiment.

As shown by FIG. 8, a layer 204 is formed or deposited upon layer 200. Layer 204 is a positive patterned catalytic resin upon layer 200 and has completed thickness which leaves top 122 of walls 120 or layer 124 exposed through layer 204. In the example process illustrated, any portions of layer 204 which initially cover. top 122 of walls 120 or layer 124 are removed. For example, in one embodiment, layer 204 initially covers top 122 of walls 120 or layer 124 and is subsequently planarized to expose top 122 of walls 120 or layer 124. In other embodiments, the removal of portions of layer 204 which initially cover top 122 of walls 120 or layer 124 may be omitted since there is no mask under the 120 features and the material would be removed post imaging and developing of the PAR resin. Layer 204 comprises the material that is subsequently patterned to form catalytic material lines 34. Accordingly, layer 204 comprises a photo patternable catalytic material having a polarity opposite to that of polymer layer 35. In the example illustrated in which polymer layer 35 comprises a negative photopolymer, layer 204 is formed from a positive photopolymer. In one embodiment, layer 204 may be formed from a photopolymer that is built with elements such as palladium. In other embodiments, other catalytic material, such as photopatternable catalytic inks may be used to form layer 204.

Figure 9:
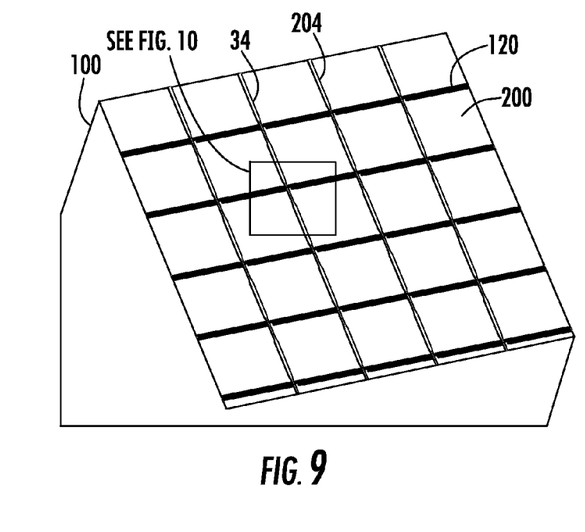
FIG. 9 is a top perspective view illustrating photo imaging and developing of the second catalytic layer according to an example embodiment.
Figure 10:
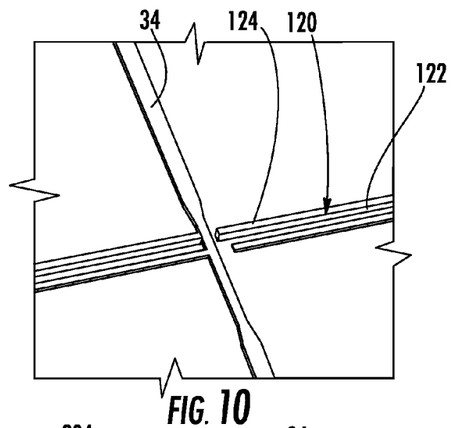
FIG. 10 is an enlarged fragmentary top perspective view of the photo imaged and developed catalytic layer of FIG. 9 according to an example embodiment.
Figure 11:
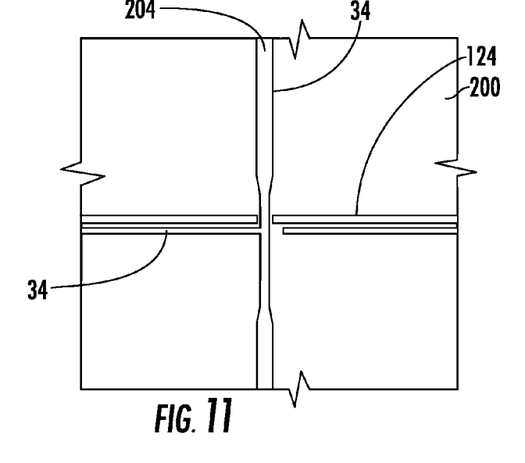
FIG. 11 is an enlarged fragmentary top plan view of the photo imaged and developed catalytic layer of FIG. 9 according to an example embodiment.

FIGS. 9-11 illustrate the patterning of layer 204 to form catalytic material lines 34. In particular, layer 204 is subjected to UV light exposure from the backside of mandrel 100 (the side of mandrel 100 opposite to topography 110) and is subsequently developed. In particular, those portions of layer 204 opposite to mask lines 106, 108 (shown in FIG. 5) are not exposed to UV light while the remaining portions of layer 204 are exposed to UV light. Those portions exposed to UV light are removed, leaving catalytic material lines 34 and exposing portions of layer 200. As a result, catalytic material lines 34 project above layer 200.

Figure 12:
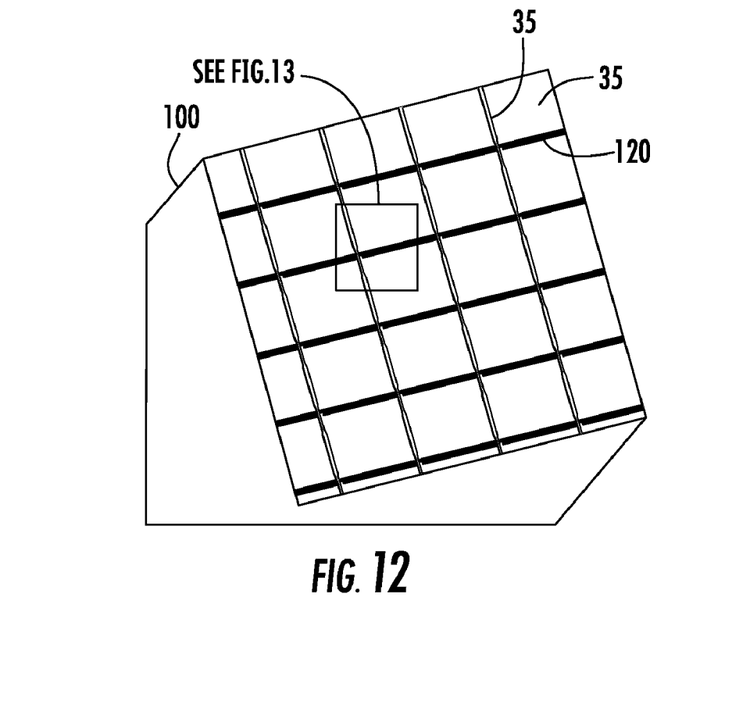
FIG. 12 is a perspective view illustrating formation and patterning of the negative polymer layer upon the first layer adjacent the second catalytic layer according to an example embodiment.
Figure 13:
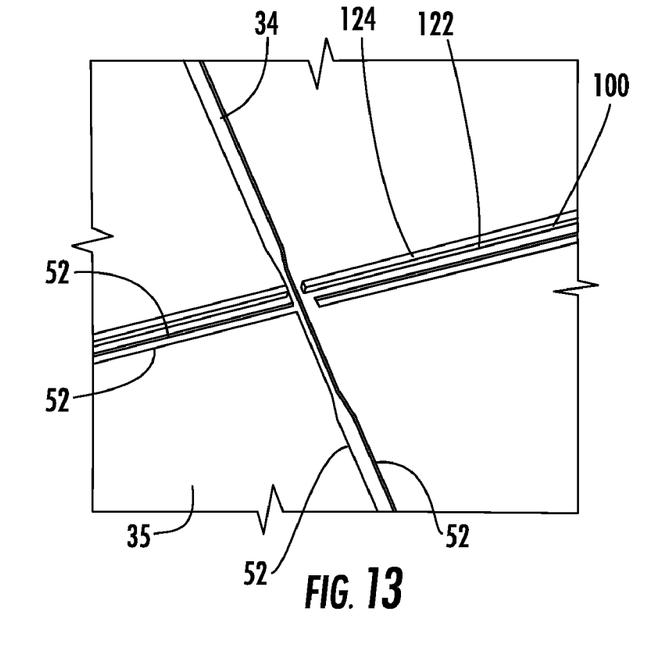
FIG. 13 is an enlarged fragmentary perspective view of the patterned resist layer of FIG. 12 according to an example embodiment.

FIGS. 12 and 13 illustrate the forming and patterning of polymer layer 35 to form sides 52 which rise above catalytic material lines 34 and which are in substantial alignment with edges of catalytic material lines 34. In the example illustrated, a negative photoresist material is blanket coated over layer 200 and over catalytic material lines 34. In one embodiment, the blanket coat also extends over walls 120 and is subsequently planarized to expose tops 222 of walls 120 and/or layer 124. After blanket coating of layer 35 and subsequent planarization, layer 35 is exposed to UV light from the backside of mandrel 100 and through mandrel 100. In particular, those portions of layer 35 opposite to mask lines 106, 108 (shown in FIG. 5) and also opposite to catalytic material lines 34 are not exposed to UV light when the remaining portions of layer 35 are exposed to UV light. Since layer 35 is formed from a negative polarity or negative photopolymer material, subsequent development results in removal of those portions of layer 35 not exposed to UV light. In particular, those portions of layer 35 overlying catalytic material lines 34 are removed,. exposing catalytic material lines 34 and forming sides 52 which project above catalytic material lines 34 and which are aligned with edges of catalytic material lines 34. Such sides 52 serve as containment structures for limiting lateral expansion of subsequently formed conductor lines 38. Because layers 204 and 35 are both patterned using the exact same photomask 102 (shown in FIG. 5) by using materials having different photo imaging polarities, the number of processing steps are reduced, lowering fabrication cost and complexity. Moreover, because the same mask 102 is used to form catalytic material lines 34 and sides 52 of dielectric layer 35, precise alignment and dimensional control may be achieved between catalytic material lines 34 and the subsequent formed conductor lines 38.

In the example illustrated, layer 35 is formed from a negative resist materials such as SU8. In other embodiments, layer 35 may be formed from other from other commerically available negative photopolymer materials. In still other embodiments, resist layer 35 may be formed from a positive photoresist material, wherein catalytic material lines 34 are formed from an opposite polarity photo-patternable material, a negative polarity photo patternable catalytic resin material. In such a case the polarity of the pattern in the mandrel would be reversed.

Figure 14:
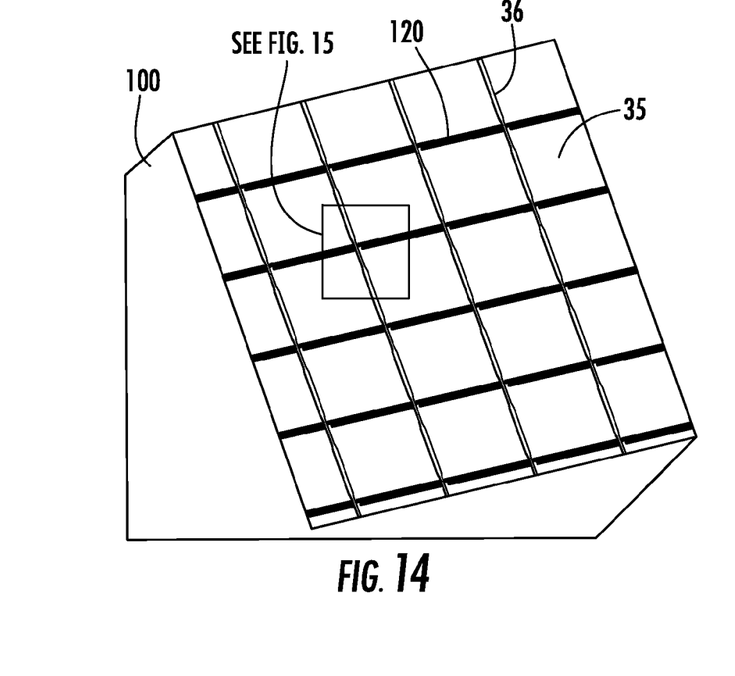
FIG. 14 is a perspective view illustrating electrolessly plating of a conductor line on the catalytic layer according to an example embodiment.
Figure 15:
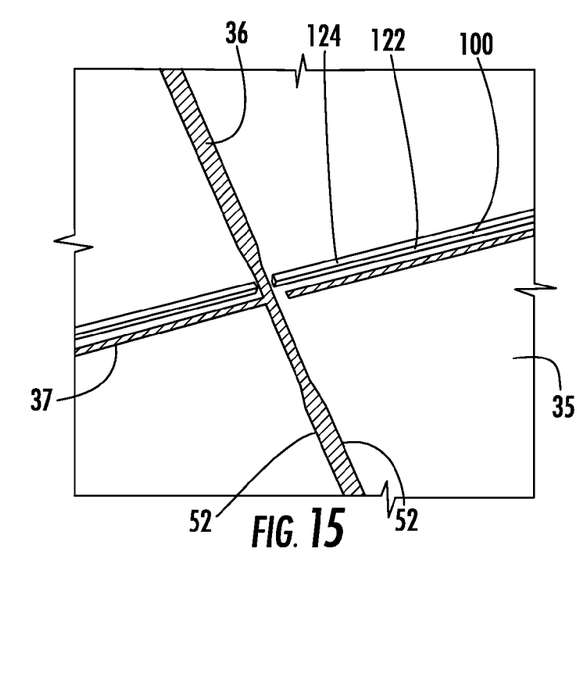
FIG. 15 is an enlarged fragmentary perspective view of the electrolessly plated conductor line of FIG. 14 according to an example embodiment.

FIGS. 14 and 15 illustrate forming of conductor lines 36. In the example illustrated, conductor lines 38 are formed by electroless plating atop catalytic material lines 34. Due to the presence of sidewalls 52, lateral growth of the electrolessly plated electrically conductive material is contained and defined in such channels between sides 52 of resist layer 35. As a result, dimensional control and alignment of lines 36 with respect to other structures of backplane 22A is achieved. In other embodiments, conductor lines 36 may be formed in other manners. For example, in another embodiment, electroless plating may be the first step, wherein electroplating is subsequently used to complete the lines 36 once the initial electroless layer is conductive enough. Such an alternative may provide enhanced plating rates.

Figure 16:
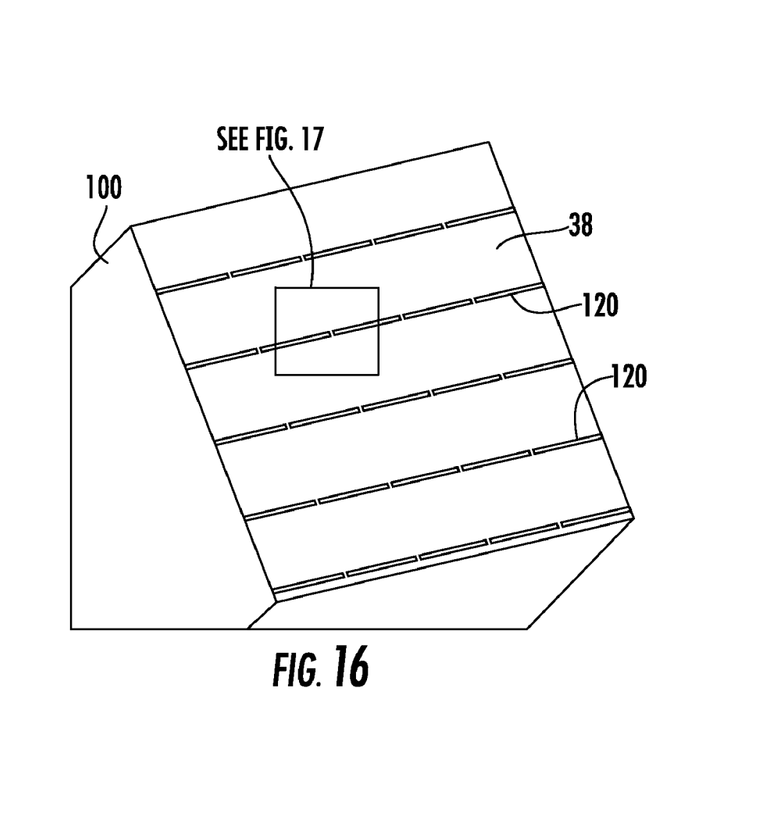
FIG. 16 is a perspective view illustrating formation of a dielectric layer on the electrolessly plated conductor lines and on the negative polymer layer according to an example embodiment.
Figure 17:
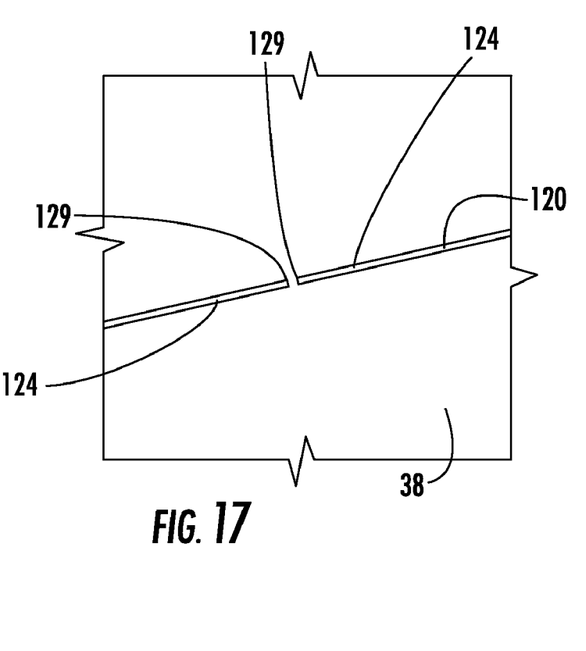
FIG. 17 is an enlarged fragmentary perspective view of the form's dialectic layer of FIG. 16 according to an example embodiment.

FIG. 16 and 17 illustrate the formation of dielectric layer 38. In the example illustrated, dielectric layer 38 is blanket coated across and over resist layer 35, electrical conductor lines 36 and on top of walls 120 or layer 124. The blanket coated layer 38 is subsequently plasma etched back to expose layer 124 upon top of walls 120. In other embodiments, dielectric layer 38 may be formed in other fashions.

Figure 18:
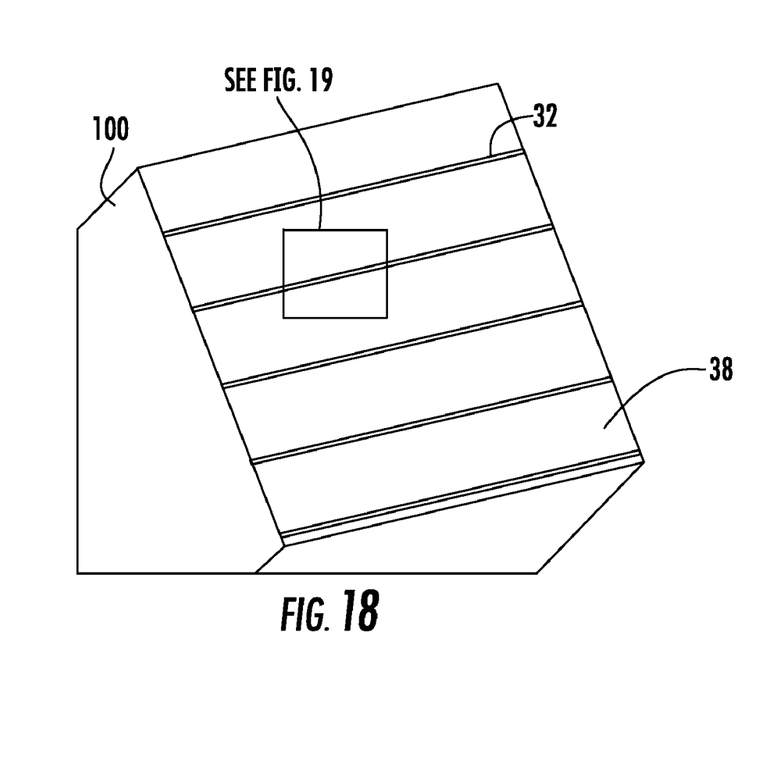
FIG. 18 is a perspective view illustrating electroplating of conductor lines to the point of merging in order to form electrical bridges according to an example embodiment.
Figure 19:
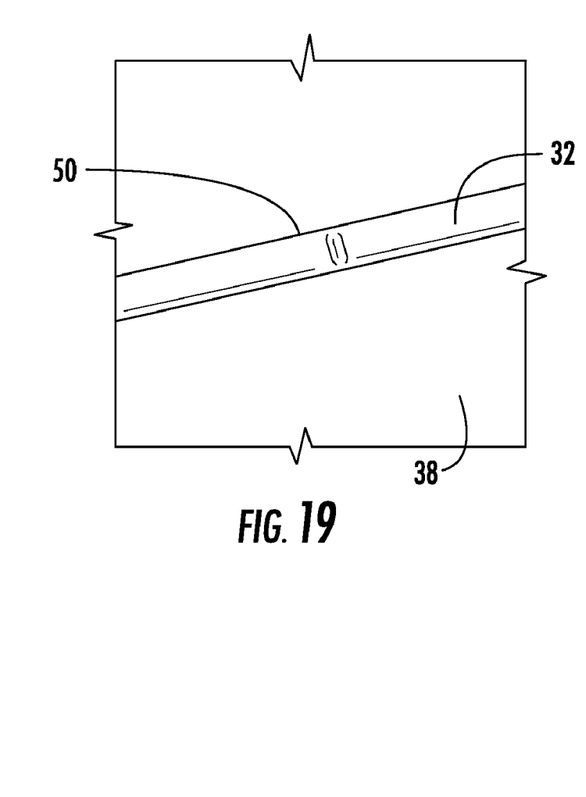
FIG. 19 is an enlarged fragmentary perspective view of electroplating conductor lines and electrical bridges of FIG. 18 taken along line 19-19 according to an example embodiment.

FIGS. 18 and 19 illustrate the forming of conductor lines 32. In the example illustrated, conductor lines 32 are formed by electroplating electrically conductive material upon tops 122 of walls 120 and upon conductive layer 124 of mandrel 100 using conductive layer 124 as a cathode. As shown in FIG. 19, the electroplating is performed in a manner (with a sufficient voltage, appropriate electrolyte and/or for a sufficient period of time) such that the electrically conductive material being electroplated forms a bridge across the terminal ends 129 of walls 120 (shown in FIG. 17) to form electrical bridges 50 (shown in FIG. 2). As shown by FIG. 2, such electrical bridges 50 are insulated or electrically spaced from conductor lines 36 by dielectric layer 38.

Figure 20:
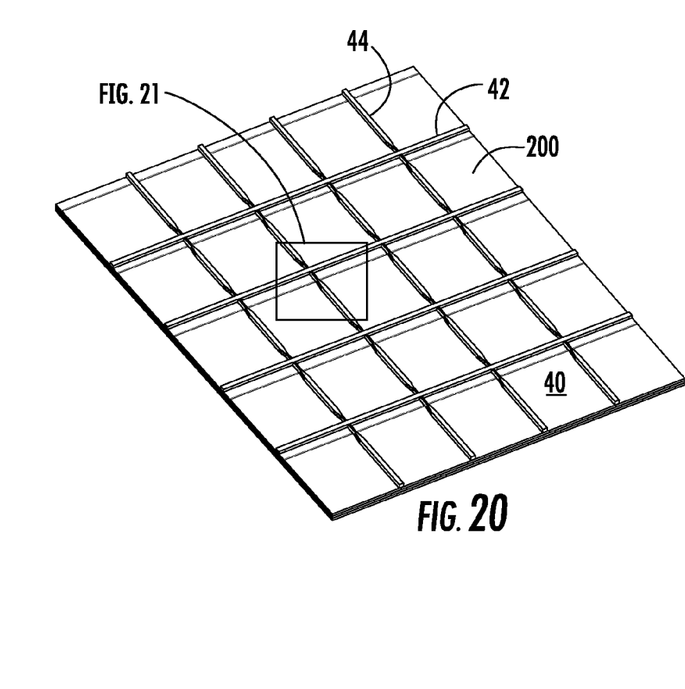
FIG. 20 is a top perspective view of a formed backplane separated from the mandrel and joined to another backplane to form the stacked display of FIGS. 1-3 according to an example embodiment.
Figure 21:
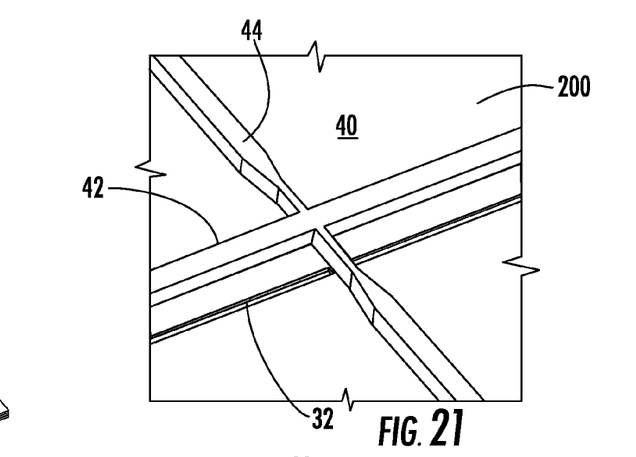
FIG. 21 is an enlarged fragmentary perspective view of the stacked display of FIG. 20 according to an example embodiment.
Figure 22:
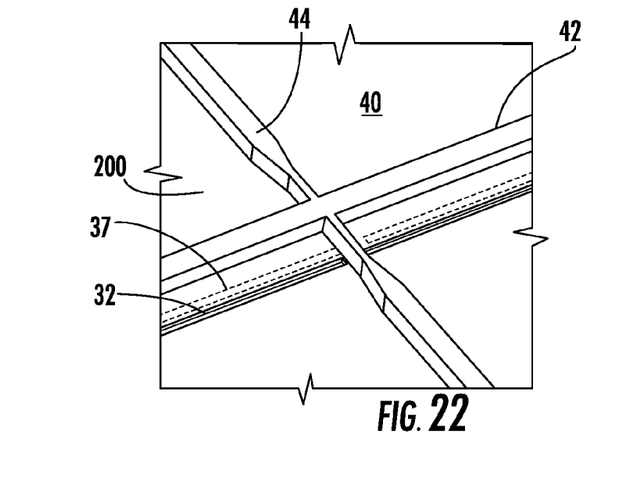
FIG. 22 is an enlarged fragmentary perspective view of the stacked display of FIG. 20 with portions shown as being transparent to illustrate the electrolessly plated conductor line according to an example embodiment.

FIGS. 20-22 illustrate joining of the substantially completed backplane 22A to backplane 22B to form the display 20 (shown in FIGS. 1-3). FIG. 20 is a top perspective view of the backplanes 22 joined to one another. FIG. 21 illustrates one of conductor lines 32 recessed below floor 40 of a pixel wells 30A and 30B. FIG. 22 illustrates portions of pixel wells 30 as being transparent for the purpose of illustrating conductor lines 36.

To join backplanes 22 to one another, bonding layer 24 is applied to at least portions of dielectric layer 35 or conductor lines 32 of one or both of backplanes 22. In one embodiment, bonding layer 24 comprises layer of a dielectric resin which is over coated upon dielectric layer 35 and conductor lines 32. Prior to curing, and while supported by their associated dedicated mandrel's 100, backplanes 22 are aligned with one another with dielectric layers 35 facing one another. Once backplanes 22 are aligned and brought into contact with one another, the dielectric resin is cured. Upon completion of curing, both mandrels 100 are separated and removed from backplanes 22. Because backplanes 22 are joined to one another while still supported by their mandrels 100, dimensional stability of backplanes 22 is maintained by the generally more rigid mandrels 100 to enhance precise alignment of backplanes 22 and their features (pixel wells 30s) with respect to one another. In other embodiments, backplanes 22 may be separated from their associated mandrels prior to being joined to one another.

Figure 23:
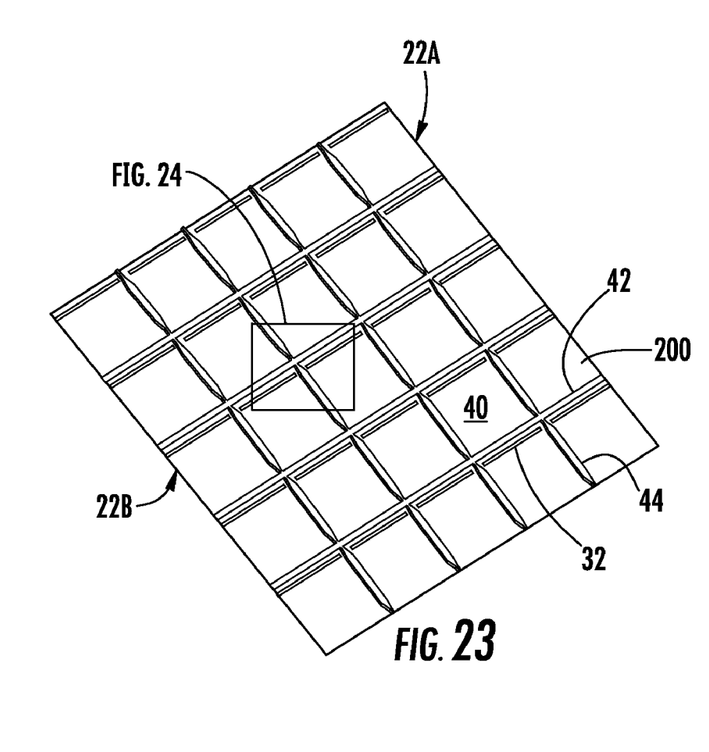
FIG. 23 is a perspective view illustrating electroplating of the electroplated conductor lines to build up the electroplated conductor lines towards floors of pixel wells according to an example embodiment.
Figure 24:
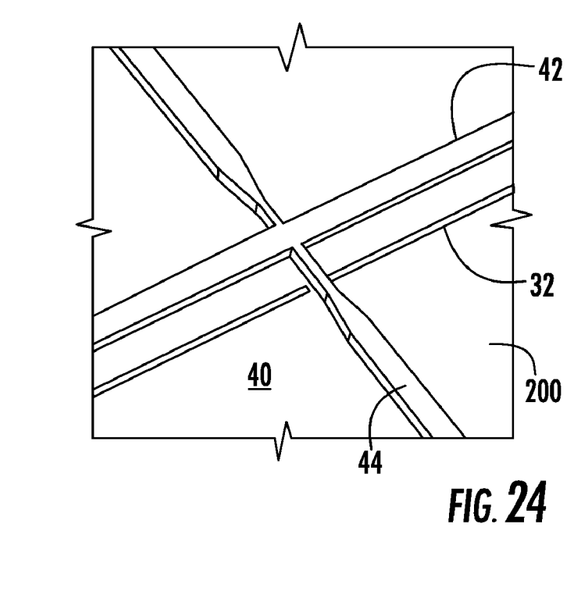
FIG. 24 is an enlarged fragmentary perspective view of the stacked display of FIG. 23 according to an example embodiment.

FIGS. 23 and 24 illustrate an optional step of building up conductor lines 32 such that conductor lines 32 extend flush with the floors 40 rather than being recessed from floors 40. According to one example embodiment, after separation of the backplane 22 from the associated mandrel 100, additional electroplating is performed on those portions of conductor line 32 that are exposed through floors 40 of pixel wells 30. During such electroplating, the recessed conductor lines 32 serve as the cathode. The electroplating is performed to build up connector lines 32 to reduce the extent that which conductor lines 32 are recessed below floors 40, to bring conductor lines 32 flush with floors 40 or to cause conductor lines 32 to project above floors 40. In other embodiments, the step may be omitted.

After backplanes 22 are joined to one another, their pixel wells are filled with electro-optical material 28 and sealed with lids 26 to produce the stacked display 20 shown in FIGS. 1-3. In yet other embodiments, backplanes 22A may alternatively be utilized in a display independent of any other backplanes (rather than a stacked display).

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements. For example, unless specifically otherwise noted, the claims reciting a layer upon or on top of a structure, encompass the layer being on and in contact with the structure, or upon or on top of one or more intermediate layers or intermediate structures that themselves are upon or on top of the structure.

What is claimed is:

1. A method comprising:
    forming pixel wells and a grid of electrical lines including electrical bridges using an ultraviolet transparent mandrel having a three-dimensional surface and an integral mask layer, wherein proud portions of the three-dimensional surface defines a first set of electrical lines and wherein the integral mask layer defines a second set of electrical lines.

2. The method of claim 1, wherein the grid of electrical lines is formed by using both positive and negative photopolymers with the integral mask layer to form a channel having a floor of a first polarity photopolymer and side walls of a second opposite polarity photopolymer that define edges of the electrical lines.

3. The method of claim 1, wherein forming pixel wells in the grid comprises:
    patterning a catalytic material upon the mandrel using the integral mask layer;
    patterning a negative photopolymer using the integral mask layer to form a channel adjacent the patterned catalytic material; and
    electrolessly plating an electrically conductive material upon the patterned catalytic material to form a first set of the electrical lines.

4. The method of claim 3, wherein the step of patterning the catalytic material includes:
    coating the catalytic material over the mandrel; and
    photo imaging the catalytic material on a first side of the mandrel by transmitting ultraviolet light through the mandrel from a second opposite side of the mandrel.

5. The method of claim 4, wherein the step of patterning the negative photopolymer includes:
    coating the negative photopolymer upon the patterned catalytic material; and
    photo imaging the negative photopolymer on a first side of the mandrel by transmitting ultraviolet light through the mandrel from a second opposite side of the mandrel.

6. The method of claim 3, wherein the step of patterning the negative photopolymer includes:
    coating the negative photopolymer upon the patterned catalytic material and
    photo imaging the negative photopolymer on a first side of the mandrel by transmitting ultraviolet light through the mandrel from a second opposite side of the mandrel.

7. The method of claim 1, wherein the proud portions include a transparent conductor thereon and wherein the electrically conductive material is electroplated upon the transparent conductor to form the first set of electrical lines.

8. The method of claim 1, wherein the electroplating is configured such that the electrically conductive material bridges over an electrical line of the second set of electrical lines during electroplating to form a electrical bridge.

9. The method of claim 1, wherein the mandrel has a first level used to locate a first set of electrical lines, a second-level used to locate a second set of electrical lines orthogonal to the first set of electrical lines and a third level used to locate a floor of the pixel wells.

10. The method of claim 9, wherein the second level is between the first level and the third level.

11. The method of claim 1, wherein the mandrel is separated from the formed pixel wells and grid of electrical lines to expose a surface previously adjacent the mandrel.

12. The method of claim 11, further comprises bonding the surface to another structure including a second set of formed pixel wells and a second grid of electrical lines to form a stack of display grids.

13. The method of claim 1, wherein the ultraviolet transparent mandrel comprises:
   first portions configured to transmit ultraviolet light;
   second portions configured to attenuate ultraviolet light; and
   a surface having a varying topography.

14. The method of claim 13, wherein one of the first portions and the second portions is arranged in a grid.

15. The method of claim 14, wherein the varying topography of the surface comprises:
   a first set of channels; and
   a second set of channels non-parallel to the first set of channels.

16. The method of claim 15, wherein the varying topography of the surface further comprises a set of spaced projecting walls.

17. The method of claim 16, wherein the mandrel further comprises a transparent electrically conductive material on a top of the projecting walls.

18. The method of claim 1, wherein the pixel wells are arranged in a grid integrally part of a single unitary body, each of the pixel wells including side walls and a floor and wherein the grid of electrical lines including electrical bridges comprises:
   a first conductor line recessed below the floor;
   a catalytic material line extending non-parallel to the first conductor line;
   a second conductor line on the catalytic material line;
   a dielectric layer on the second conductor line, wherein the first conductor line is electroplated across the dielectric layer on the second conductor line.

19. The method of claim 18, wherein the pixel wells comprise a photopolymer forming channel walls in alignment with edges of the catalytic material line and contacting opposite side edges of the second conductor line.

20. A method comprising:
   forming pixel wells and a grid of electrical lines including electrical bridges using an ultraviolet transparent mandrel having a three-dimensional surface and an integral mask layer, wherein the grid of electrical lines is formed by using both positive and negative photopolymers with the integral mask layer to form a channel having a floor of a first polarity photopolymer and side walls of a second opposite polarity photopolymer that define edges of the electrical lines.

21. A method comprising:
   forming pixel wells and a grid of electrical lines including electrical bridges using an ultraviolet transparent mandrel having a three-dimensional surface and an integral mask layer, wherein forming pixel wells in the grid comprises:
   patterning a catalytic material upon the mandrel using the integral mask layer;
   patterning a negative photopolymer using the integral mask layer to form a channel adjacent the patterned catalytic material; and
   electrolessly plating an electrically conductive material upon the patterned catalytic material to form a first set of the electrical lines.

22. The method of claim 21, wherein the step of patterning the catalytic material includes:
   coating the catalytic material over the mandrel; and
   photo imaging the catalytic material on a first side of the mandrel by transmitting ultraviolet light through the mandrel from a second opposite side of the mandrel.

23. The method of claim 22, wherein the step of patterning the negative photopolymer includes:
   coating the negative photopolymer upon the patterned catalytic material; and
   photo imaging the negative photopolymer on a first side of the mandrel by transmitting ultraviolet light through the mandrel from a second opposite side of the mandrel.

24. The method of claim 21, wherein the step of patterning the negative photopolymer includes:
   coating the negative photopolymer upon the patterned catalytic material and
   photo imaging the negative photopolymer on a first side of the mandrel by transmitting ultraviolet light through the mandrel from a second opposite side of the mandrel.

25. A method comprising:
   forming pixel wells and a grid of electrical lines including electrical bridges using an ultraviolet transparent mandrel having a three-dimensional surface and an integral mask layer, wherein the mandrel has a first level used to locate a first set of electrical lines, a second-level used to locate a second set of electrical lines orthogonal to the first set of electrical lines and a third level used to locate a floor of the pixel wells.

26. The method of claim 25, wherein the second level is between the first level and the third level.

27. A method comprising:
   forming pixel wells and a grid of electrical lines including electrical bridges using an ultraviolet transparent mandrel having a three-dimensional surface and an integral mask layer, wherein the ultraviolet transparent mandrel comprises:
   first portions configured to transmit ultraviolet light;
   second portions configured to attenuate ultraviolet light, wherein one of the first portions and the second portions is arranged in a grid; and
   a surface having a varying topography, wherein the varying topography of the surface comprises:
   a first set of channels; and
   a second set of channels non-parallel to the first set of channels.

28. The method of claim 27, wherein the varying topography of the surface further comprises a set of spaced projecting walls.

29. The method of claim 28, wherein the mandrel further comprises a transparent electrically conductive material on a top of the projecting walls.

30. A method comprising:
   forming pixel wells and a grid of electrical lines including electrical bridges using an ultraviolet transparent mandrel having a three-dimensional surface and an integral mask layer, wherein the pixel wells are arranged in a grid integrally part of a single unitary body, each of the pixel wells including side walls and a floor and wherein the grid of electrical lines including electrical bridges comprises:
   a first conductor line recessed below the floor;
   a catalytic material line extending non-parallel to the first conductor line;
   a second conductor line on the catalytic material line;
   a dielectric layer on the second conductor line, wherein the first conductor line is electroplated across the dielectric layer on the second conductor line.

31. The method of claim 30, wherein the pixel wells comprise a photopolymer forming channel walls in alignment with edges of the catalytic material line and contacting opposite side edges of the second conductor line.

* * * * *

UNITED STATES PATENT AND TRADEMARK OFFICE
CERTIFICATE OF CORRECTION

PATENT NO. : 8,293,455 B2
APPLICATION NO. : 12/251055
DATED : October 23, 2012
INVENTOR(S) : Alan R. Arthur et al.

Page 1 of 1

It is certified that error appears in the above-identified patent and that said Letters Patent is hereby corrected as shown below:

In column 7, line 31, delete "microns-" and insert -- microns --, therefor.

In column 7, line 33, delete "microns-" and insert -- microns --, therefor.

In column 10, line 5, delete "removed,." and insert -- removed, --, therefor.

Signed and Sealed this
Nineteenth Day of February, 2013

Teresa Stanek Rea
*Acting Director of the United States Patent and Trademark Office*